US006756250B2

(12) United States Patent
Roberts

(10) Patent No.: US 6,756,250 B2
(45) Date of Patent: Jun. 29, 2004

(54) DYNAMIC CONTACT ORIENTING UNIVERSAL CIRCUIT GRABBER

(75) Inventor: Joseph A Roberts, Hudson, NH (US)

(73) Assignee: Miraco, Inc., Manchester, NH (US)

( * ) Notice: Subject to any disclaimer, the term of this patent is extended or adjusted under 35 U.S.C. 154(b) by 0 days.

(21) Appl. No.: 09/991,592

(22) Filed: Nov. 16, 2001

(65) Prior Publication Data

US 2002/0081891 A1 Jun. 27, 2002

Related U.S. Application Data

(62) Division of application No. 09/479,956, filed on Jan. 10, 2000, now Pat. No. 6,375,489.

(51) Int. Cl.[7] .......................... H01L 21/50; H01R 11/20

(52) U.S. Cl. ....................... 438/106; 439/410; 439/261; 439/393

(58) Field of Search ................................ 438/106, 121; 439/410, 261, 393, 259, 67, 77, 417, 427, 329, 933, 391, 86, 891, 884, 387

(56) References Cited

U.S. PATENT DOCUMENTS 5,096,426 A * 3/1992 Simpson et al. .............. 439/66
5,709,562 A * 1/1998 Kourimsky ................. 439/267
5,938,451 A * 8/1999 Rathburn ..................... 439/66
5,939,672 A * 8/1999 Tang ......................... 174/50.5
2003/0082851 A1 * 5/2003 Van Hoff .................... 438/107

* cited by examiner

*Primary Examiner*—David Nelms
*Assistant Examiner*—Long Tran
(74) *Attorney, Agent, or Firm*—Devine, Millimet & Branch; Paul C. Remus; Michelle S. Temple

(57) ABSTRACT

The invention is an electrical connection system that releasably connects the circuit paths of a flexible conductive circuit to a printed circuit board having a corresponding row of contacts, without the need for soldering, crimping or welding operations, or extensive preparation of the flexible circuit before connection. One embodiment has a least one spring contact formed in a cover; at least one rotatable cam; and a base. The cover and base snap together to house the rotatable cam(s). The connection is made by feeding the circuit into a slot in the cam, then rotating the cam to bring the circuit into contact with the spring contact which has a tapered insulation plane that pierces and peels back the dielectric covering of the conductive circuit to make a direct metal to metal, gas tight contact between the deflectable contact and the conductors of the conductive circuit.

7 Claims, 8 Drawing Sheets

DYNAMIC CONTACT ORIENTING UNIVERSAL CIRCUIT GRABBER

The present application is a divisional application based on and claiming priority from patent application Ser. No. 09/479,956 of the same title now U.S. Pat. No. 6,375,489 filing date Jan. 10, 2000.

FIELD OF THE INVENTION

The invention relates generally to multi-terminal or multi-contact electrical connectors to connect electrical contacts of various shapes. The invention relates more specifically to electrical connectors of the insulation piercing, gas tight electrical connection type to quickly and inexpensively interconnect a wide variety of contacts to conventional flexible circuit, tape cable or encapsulated round wire harness. Most specifically the invention relates to an electrical connector that terminates more than twice the number of contacts per inch than a conventional insulation displacing connector and eliminates the expense of soldering, crimping or welding usually associated with the attachment of a connector contact to an interconnect circuit.

BACKGROUND OF THE INVENTION

Conventional electrical connectors are designed to connect the circuit paths of a flexible circuit to a spring contact system. Usually the surface of the flexible circuit needs to be prepared before connection. Preparation of a flexible circuit usually includes labor intensive activities such as stripping off the dielectric, cleaning the exposed conductor or wire and then soldering each individual conductor of the spring contact system to each conductor or wire of the flexible circuit. As part of the reason many connectors require intensive preparation of the flexible circuit, many conventional connectors do not provide a wiping action to clean the conductors of the flexible circuit. Some connectors also do not provide a gas tight seal when the electrical connection is made, allowing air to contact the conductors causing oxidation, and consequent degradation in the quality of the connection due to the oxidation on the conductors.

Many conventional multi-terminal connectors comprise male and female housings that fasten together to secure coupling of terminals mounted within the housings. Many connectors require a fair amount of force to completely engage the many terminals being connected. Zero insertion force type connectors aim at reducing or eliminating the force typically needed to make the connection. In reducing the force, some connector systems use camming devices or cam lock features. Cam lock features typically include one or more cam surfaces on an operator handle or lever that is mounted to the housing of one of the connector halves to be mated. The other connector housing has one or more protruding cam followers to engage the cam surface(s) so that as the lever or handle is moved in the desired direction, the cam surface(s) act on the cam follower(s), drawing the connector halves together and forcing secure engagement of the contacts.

Other zero insertion force type connectors conventionally have a housing mounting a plurality of terminals in a generally parallel array. An actuator, such as a pressure member, is used to press the flexible flat cable, flexible printed circuit board or the like against contact portions of the terminals. In order to keep the size of the connectors relatively small, and the insertion force required to connect the terminals to a minimum, some connectors have been designed with actuators or pressure members which are rotatably or pivotally mounted on the housing for movement between first, open positions allowing free insertion of the cables into the connector housings, and second, closed positions for clamping the flat cables against the contact portions of the terminals.

One of the problems with connectors having rotatable actuators, cams or pressure members is the tendency of moving the pressure member back toward its open position when undesired external forces are applied to the flexible flat cable. The flexible flat cable tends to raise and rotate the pressure member, thereby releasing the flexible flat cable from the connector, and possibly damaging the terminals in the process of the flexible flat cable being pulled out of or disconnected from the connector.

Thus there is a need for an inexpensive, easily assembled connector that eliminates the expensive, time consuming preparation steps common to use of most connectors, and that eliminates strain on the electrical connection or inadvertent disconnection, by securely locking the flexible flat cable, flexible printed circuit board, round wire interconnect or the like in place within the connect, while producing a gas tight seal.

SUMMARY

The basic embodiment of the invention is a connector that accurately aligns each contact to its assigned conductor. Individual contacts of at least one contact or at least one compound dynamic contact gradually engage the conductive circuit (flat flexible cable, flexible printed circuit board, round wire interconnect) and apply sufficient force to pierce, via a tapered insulation plane on each contact, through the circuit's dielectric but not its individual conductors. The contact(s) are deflected, in a first deflection range, by the circuit's conductor in such a way as to skive off (remove, peel off) all the insulating dielectric and a majority of the adhesive on one side of the conductive circuit without totally piercing the conductor.

In one embodiment, may be a rotatable cam or cylinder into which the circuit passes. A portion of the circuit is retained in the cam. The circuit may enter partially or pass all the way through the cam. As the cam or cylinder rotates through its rotation cycle, the conductive circuit is wrapped around it, and the cam or cylinder includes raised features designed to lift at least one conductor of a flexible circuit into an electrical connection with a deflectable contact and to then lift the deflectable contact into a second deflection range. The contact(s), as it is deflected into the second deflection range, moves the contact's insulation plane into a neutral (non-cutting) position and significantly increases the contact force on the circuit's conductor.

This sequence of mechanical events brings the optional force concentrators on the contact(s) into a high pressure connection with the conductive circuit's conductors. The contact is designed to apply sufficient pressure between each contact and its mating conductor to pierce through any remaining adhesive and make a metal to metal, or surface finish to surface finish gas-tight electrical connection. In another embodiment, there may be a contact module containing at least one compound dynamic contact, but with a contact activation portion instead of a cam. In either embodiment, a simple contact having an insulation plane pierces and peels back the top layer of dielectric from a flexible conductive circuit such that a partial seal is formed between each contact and the individual conductors of the flexible conductive circuit.

Therefore an aspect of invention is to provide an interconnect system to quickly and inexpensively interconnect a wide variety of shapes of contacts to conventional conductive circuits such as flexible circuit, tape cable, or encapsulated round wire harness.

Another aspect of the invention is to provide an interface within the connector's body wherein the connector is adaptable to an application specific contact shape exiting the connector body. Exiting contacts may be designed as a simple pin for insertion into a printed circuit board or a complex spring designed to mate with other connectors.

A further aspect of the invention is to provide a connector that eliminates the expense of removing the insulation and cleaning the conductors of the flexible circuit and soldering, crimping or welding that is usually associated with the attachment of a connector contact to an interconnect circuit.

Yet another aspect is to provide a sealing mechanism wherein the displaced dielectric and adhesive of the conductive circuit are compressed against the side walls of the connector housing providing a partial contact to conductor seal. The seal can be easily made permanent by heating each circuit conductor to a temperature that causes the dielectric to flow and thereby seal the contact to conductor interface.

A still further aspect is to provide a connector that only pierces through the upper layer of a conductive circuit's dielectric, leaving the base laminate layer intact. By eliminating the need to remove or penetrate the base layer of dielectric, the conductive circuit's dimensional stability is maintained and tearing or damaging the conductive circuit is avoided. Also any risk of changing the conductive circuit's electrical or dielectric parameters is avoided.

A further aspect of the invention is to provide a connector that can be mounted to the end of a flexible conductive circuit without first removing the dielectric from the terminating area, that can be mounted without the use of tooling, and that can be easily coupled to a mating connector with minimal hand movements and without having to observe the connection site.

Still another aspect is to provide a connector that is relatively easy and inexpensive to make in quantity.

Still another aspect is to provide a connector that configures the flexible circuit in a manner that strain relieves the circuit and in so doing protects the contact to conductor electrical interface.

Still another aspect is to provide a low pressure contact system that may be used in those figs applications requiring a gold to gold interface or a ZIF (zero insertion force) style connector. In this type of application the flexible circuits insulating overlay must be first removed from the circuit before it is inserted into the connector.

Other aspects of the invention will be exemplified by the following drawing figures, detailed description of the preferred embodiments of the invention, and the appended claims.

DETAILED DESCRIPTION OF THE PREFERRED EMBODIMENTS

Figure 1B:
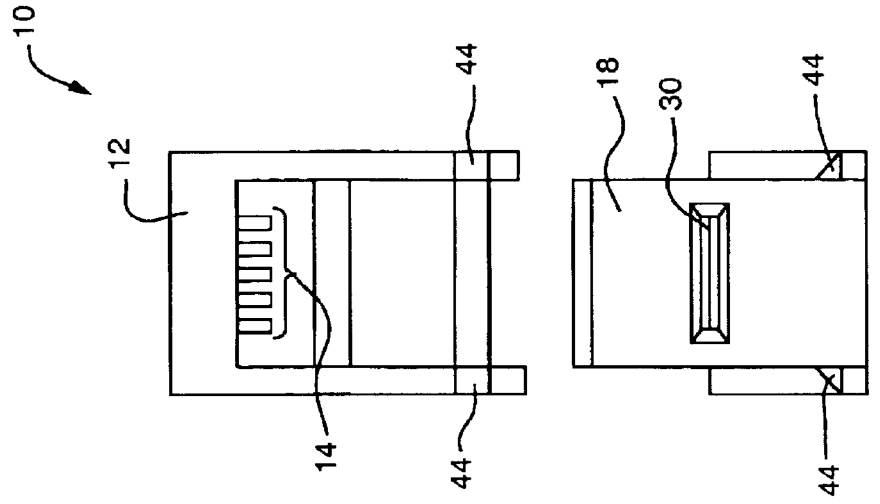
FIG. 1*b* is an exploded front view of the connector of FIG. 1*a*.

Referring now to the drawings, like reference numerals refer to like elements throughout. Most basically the invention comprises a spring contact which may have a tapered insulation plane that can pierce and peel back the top layer of dielectric of a flexible circuit and form a gas-tight, surface finish to surface finish seal.

Figure 1A:
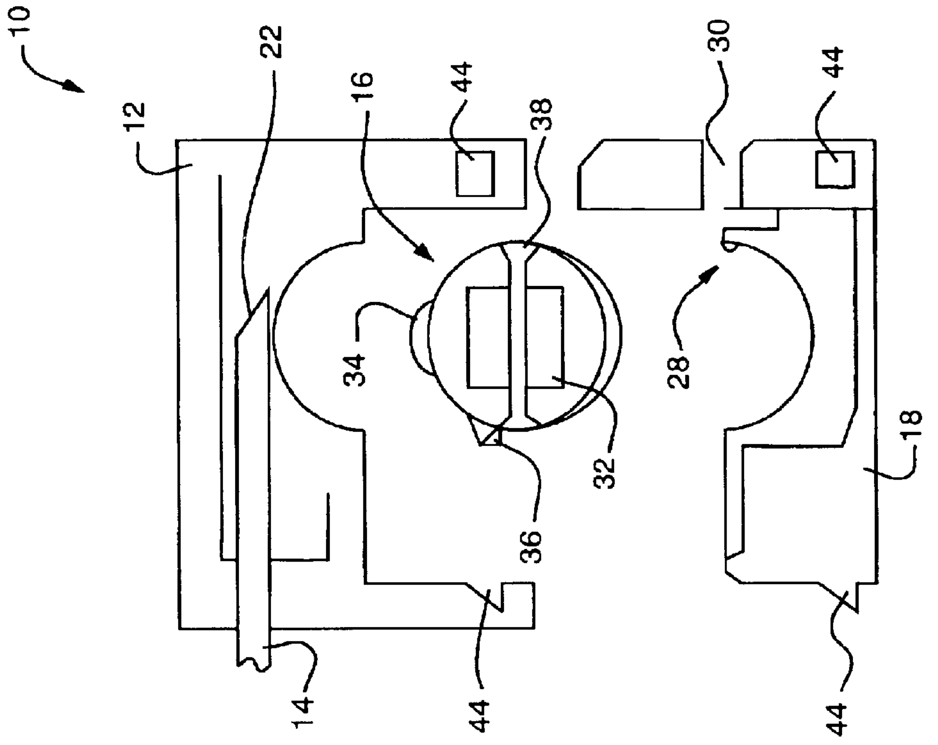
FIG. 1*a* is an exploded cross sectional end view of the connector embodiment using a cam.

One embodiment of the invention is connector 10 which has three basic parts, as shown in FIG. 1*a*, a molded cover 12 which may have at least one molded-in, press fit, heat swaged, or otherwise attached deflectable spring contact 14 which may be a single contact or a compound dynamic contact, at least one free-floating, activation cam 16 rotatably disposed within the molded cover 12, and a molded base 18. The molded cover 12 and base 18 form a housing in which activation cam 16 is rotatably mounted, and the at least one deflectable spring contact 14 is connectable to at least one conductive circuit 20 such as a flexible printed circuit board, flat flexible cable or round wire interconnect.

A key to the invention is the deflectable contact 14. Contact 14 is geometrically shaped and mechanically designed and positioned in relationship to a flexible conductive circuit 20 to, when force is applied, be stiff enough to press into contact with exposed conductors of the at least one conductive circuit. If a tapered insulation plane 22 is used, contact 14 should be stiff enough to pierce through the top layer of an insulating dielectric 20*a*, but compliant enough to be deflected along the conductive layer in such a manner as to cause contact 14 to travel over the surface of the conductive circuit and scrape off the top layer of insulating dielectric 20*a* and 0.0001" to 0.001" of the conductive layer's surface to make a reliable electric connection that is at least partially sealed. The piercing and scraping process sufficiently deflects spring contact 14 to generate the control force necessary to make and maintain a reliable electrical interconnection between contact 14 and the conductive material of conductive circuit 20. As shown in FIG. 1*b*, base 18 also may include a circuit alignment window 30 to provide rough initial alignment of conductive circuit 20 with cam 16 when circuit 20 enters connector 10.

The connector is designed for ease of assembly. It can be snapped together, for example using snap mechanisms 44 as shown in FIG. 1*a*, and therefore eliminates expensive, time consuming ultrasonic or heat fusing assembly equipment typically needed to form conventional electrical connectors. In addition the connector 10 can therefore be easily disassembled and repaired or parts replaced as necessary. Connector 10 may contain one, or two or more, single or compound dynamic contacts 14 and activation cams 16 as required to terminate two or more conductive circuits 20. Cam(s) 16 may be formed in varying round and oval shapes in order to accommodate conductive circuits of different thicknesses, yet all varieties of cam 16 fit in one size cover 12 and base 18. For example, cam 16 may be oval, or may be round, or cylindrical, with raised features to lift at least one conductor of a flexible, conductive circuit into electrical connection with a deflectable contact, and as the cam continues to rotate, lift the contact from a first to a second deflection range.

Figure 2A:
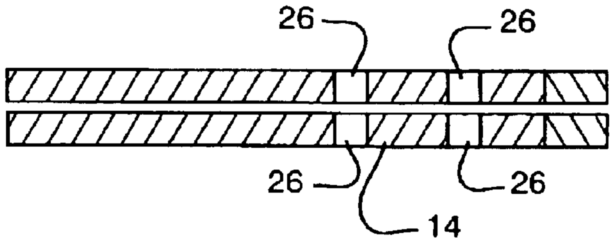
FIG. 2*a* is a top view of a compound dynamic contact, showing, in this example, two individual contacts, spaced apart by dielectric, and laminated together.

As shown, for example, in FIGS. 1*a*, 1*b*, and 2*a*, molded cover 12 contains at least one spring contact 14. As shown in FIG. 2*a*, spring contact 14 may be multiple individual contacts laminated together to form a compound contact. A compound contact 14 may also be formed of layers of contacts that may be stacked vertically or horizontally and shaped to accommodate contact deflection and applied pressure requirements of any particular chosen application. Cover 12 adds structural support to the connector 10 and maintains orientation of the spring contact(s) 14 being connected during the assembly process. Contact pitch, alignment, configuration and stored energy (contact mass and deflection range) are design dependent features and may be easily adjusted to accommodate special requirements. Special requirements may include, but are not limited to, modifying contact pitch center or power requirements within a particular connector, or accommodating special dielectric requirements such as thicker or thinner dielectrics. The configuration of contact(s) 14, including the length, thickness, and structural make up, in combination with the mechanical advantages of the connector 10, and cam 16, allow connector 10 to be easily adaptable for use with various conductive circuits 20.

Whether single or compound, contact 14 is a flat design that allows it to reliably connect to closely packed conductors. To maintain the desired stored energy in contact 14, a compound contact is formed from a composite laminated contact design, as shown in FIG. 2*a*. Compound dynamic contact 14 is two or more individual contacts that are laminated together to create a mechanically sound contact structure. For example, 0.005" thick contacts are separated by a thin film dielectric, about 0.001" thick, placing the contacts on 0.006" pitch centers. By laminating two or more individual contacts together with a structurally enhanced dielectric that has, for example, been created with its molecular, granular or fiber particles oriented to accommodate movement in one direction over another, contact mass and deflection range, and electrical characteristics can be significantly improved while using contacts that are 50% or more thinner than those required to achieve the same results using individual contacts. Components layers of a compound contact may be stacked either vertically or horizontally to accommodate the dynamics and pressure requirements of a particular application. The invention thus can terminate to tightly packed conductors. The use of a structurally enhanced dielectric increases a compound contact's strength through the laminating process. FIG. 2*a* illustrates a compound dynamic contact 14 capable of terminating to conductors on 0.006 inch pitch centers.

The material, thickness and width of contact(s) 14 is selected based on the particular application's required contact deflection range and interconnect force. Contact(s) 14 may be formed from a spring wire or may be etched or stamped from a spring material. Contact 14, formed in the manner of the invention, stores and applies the necessary contact pressure on demand. Contact 14 provides a wiping contact, as it is connected to a conductor. The deflection capability of contact 14 compensates for variations in the thickness of conductive circuits 20 being connected with connector 10. In composite contact 14, the dielectric laminating the individual contacts together provides required insulating material and stabilizes individual contacts, thus insuring that the individual contacts maintain their spaced relationship, and any mechanical requirements.

The single or compound deflectable contact 14 may have, at the end that connects to an electrically conductive circuit 20, a tapered, pointed insulation plane 22, as shown in FIGS. 1*a*, 2*b*, 2*c*, 3*a*, and 4. During connection, the rotating cam 16 lifts the circuit 20 forcing it to engage the pointed insulation plane 22 which then pierces and peels off the top dielectric and adhesive from the conductive circuit 20, thereby exposing the circuit's conductor, while leaving the base or bottom layer of dielectric intact. Thus, unlike conventional insulation-displacing connectors and contacts which penetrate and weaken the circuit's base dielectric, the invention provides a contact and process that maintains the structural integrity of a circuit's base dielectric laminate by electrically terminating to the surface of each conductor.

Also, optionally, at the connection end of contact 14 may be a plurality of force concentrators 24 that accentuate pressure at the interface between spring contact 14 and circuit conductor 20 as required to penetrate any remaining adhesive not peeled back by insulation plane 22 and also to scrape off about 0.0001" to 0.001" of the conductive material of conductor 20 to clean off any metal oxides, such as tin or copper oxide, that may have formed on the conductive material, to create a metal to metal, gas tight electrical connection between spring contact 14 and conductive circuit 20.

Figure 2B:
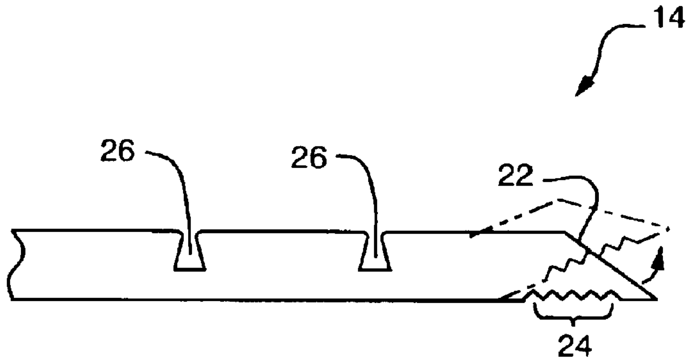
FIG. 2*b* is a side plan view of a contact with compression notches and force concentrators showing the first deflection range.
Figure 2C:
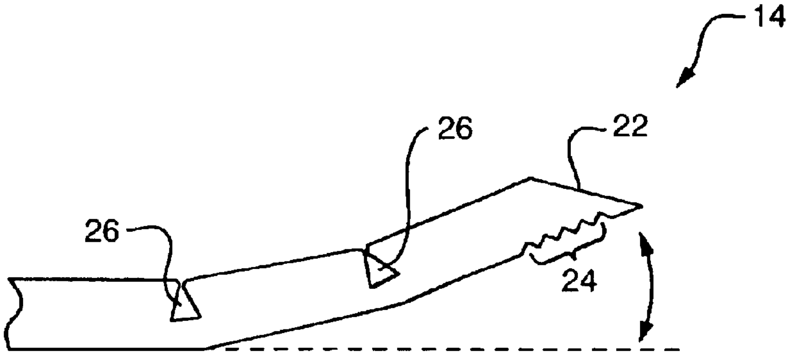
FIG. 2*c* is a side plan view of a contact with compression notches and force concentrators, showing the second deflection range as the compression notches collapse.

Compared to conventional high density contacts and connectors, compound dynamic contacts 14 have two or more deflection ranges A and B through which they flex during connection, as best shown in FIGS. 2*b* and 2*c*. The force each contact 14 applies as it passes through the deflection ranges may be controlled by optional contact compression notches 26, also shown in FIGS. 2*b* and 2*c*. FIG. 1*a* shows a contact 14 with no force concentrators or compression notches. The first deflection range A provides force strong enough to pierce and peel off the dielectric of conductive circuit 20, but not to pierce the metal (for example, copper) conductors. The force supplied in the first deflection range A is determined by the minimum thickness of the contact, as shown in FIG. 2*b*. If compression notches 26 are used, as the compression notches close, they activate the stored energy of the entire contact 14. By way of general example, if the contact's body is twice as thick as the thinnest portion of the compression notch, then closing the notch will approximately double the contact's applied force. The typical force required to pierce and peel the dielectric off its conductor may be as little as 75 grams while Applicant's invention can generate and maintain approximately 150 grams of contact force to achieve a gas tight connection. At least a partially sealed contact 14 to conductor 20 interface occurs as the peeled off, displaced dielectric of conductive circuit 20 compresses around the mating conductors. The partial seal is formed of adhesive and dielectric (for example, polyester). The seal is caused in part by the compliant nature of the dielectric and adhesive of conductive circuit 20, in part by the memory induced into the dielectric of flexible circuit 20 during the laminating process, and in part by the 'desire' of the dielectric and adhesive of conductive circuit 20 to reoccupy the space from where it was peeled, where contact 14 is now present. The seal can easily be made permanent by heating each individual contact of contact(s) 14 to a temperature that causes the dielectric to re-flow (melt) and thereby seal the contact to circuit interface. Thus, the dielectric, instead of being scraped off and discarded, can essentially be reused in situ to reform around the newly made electrical connection.

Figure 4:
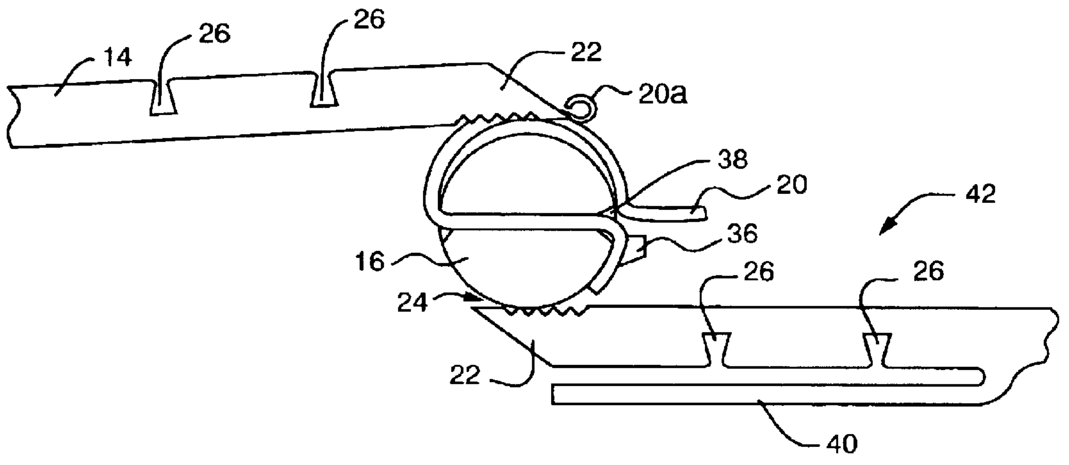
FIG. 4 is a cross sectional view of the activation cam after it has been rotated, showing how the contact(s) pierces and peels back the dielectric insulation from the conductive flexible circuit to make a direct contact between the contact (s) and the conductors of the conductive flexible circuit. This figure also shows an optional second contact.
Figure 5A:
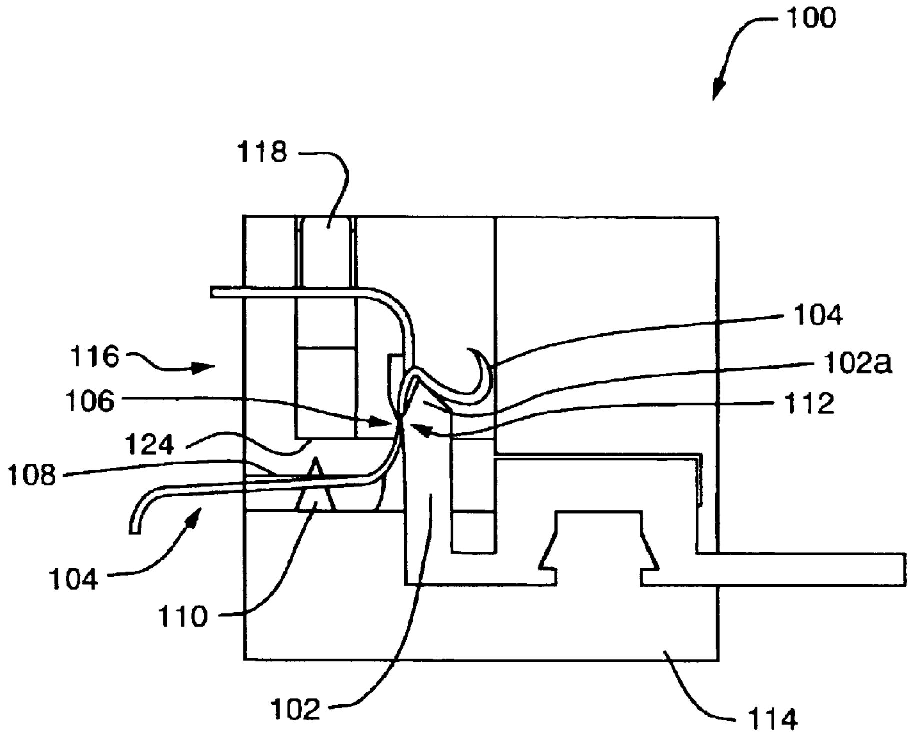
FIG. 5*a* is a cut away side view of the activation module embodiment of the invention, with a flexible circuit contact inserted.
Figure 5B:
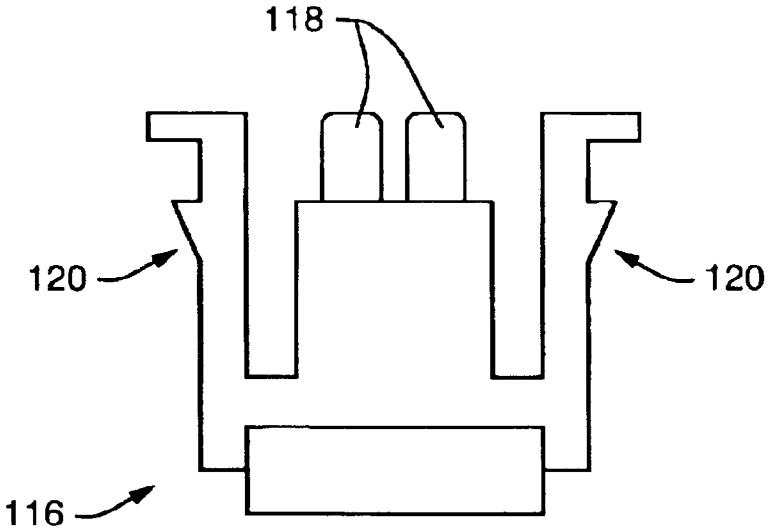
FIG. 5*b* is an end view of the activation portion of the embodiment that does not use a cam.
Figure 5C:
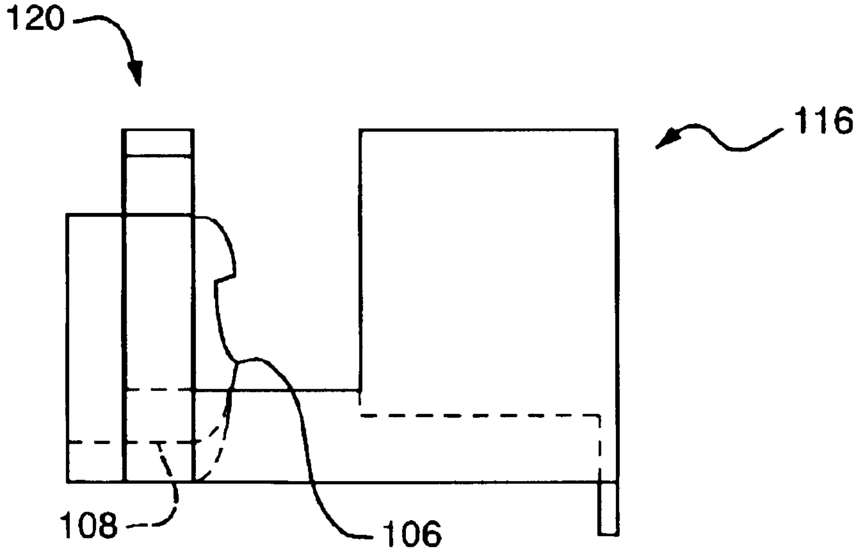
FIG. 5*c* is a side view of the activation portion of the embodiment that does not use a cam.
Figure 5D:
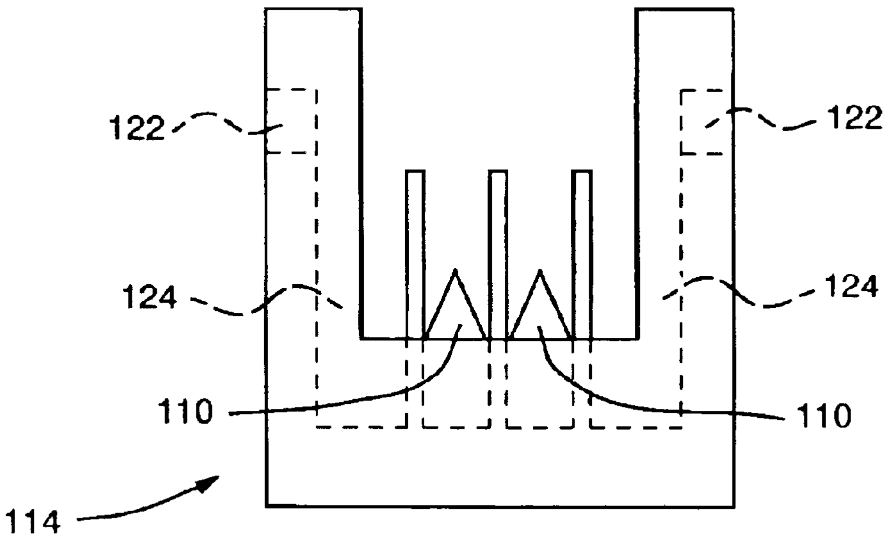
FIG. 5*d* is an end view of the contact support portion of the embodiment that does not use a cam.
Figure 5E:
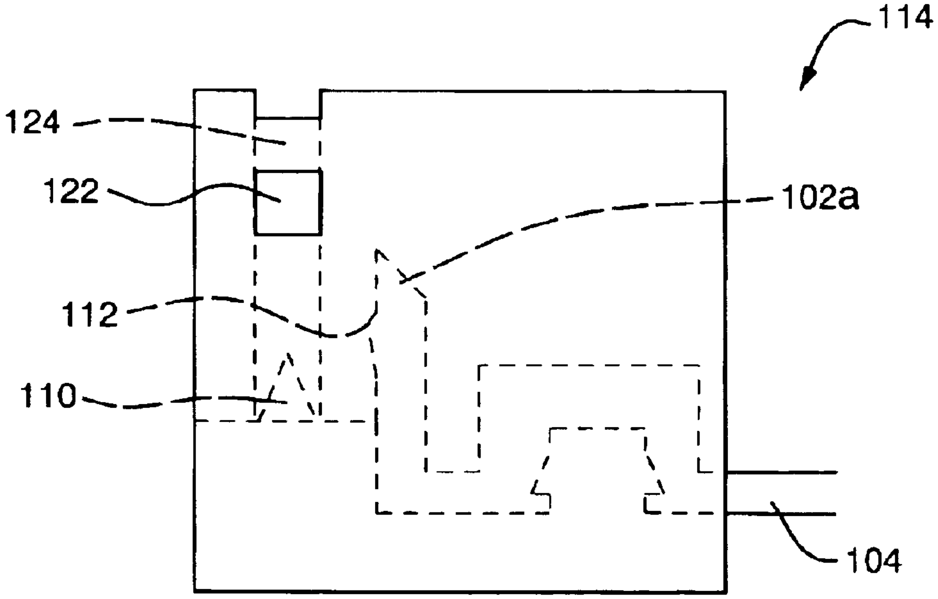
FIG. 5*e* is a side view of the contact support portion of the embodiment that does not use a cam.

As described above maybe at least one compound dynamic contact 14 molded into cover 12. However a second compound dynamic contact 42 may be molded in to base 18 such that a compound dynamic contact is positioned on either side of cam 16, about 180 degrees apart, as shown in FIG. 4, to increase the density of contacts that may be connected within connector 10. Shown in FIG. 4 is an optional force concentration extender 40 which may be molded into contact 14 and/or 42, or cover 12 or base 18 to provide additional compression force to aid contact 14 in piercing and peeling the dielectric of circuit 20.

As shown in FIG. 1*a*, activation cam 16 is housed within molded cover 12 and base 18. When disposed in cover 12 and base 18, cam 16 accurately aligns with compound dynamic contact 14 and, during connection, aligns the individual conductors of conductive circuit 20 to the individual contacts of contact(s) 14. Cam 16 is rotated to make the electrical connection. Cam 16 is rotatable by inserting an activation tool (not shown) into cam activation socket 32, shown in FIGS. 1*a* and 3*d*. As a security feature, cam activation socket may have a customized shape, requiring a customized tool for operation such that only a user with the appropriately shaped tool could activate the cam.

Figure 3A:
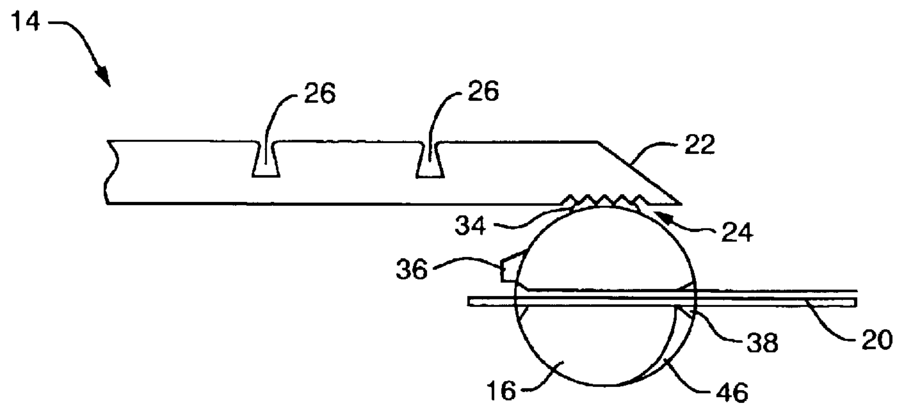
FIG. 3*a* is a cross sectional view of the activation cam, and at least one contact, with a circuit inserted.
Figure 3B:
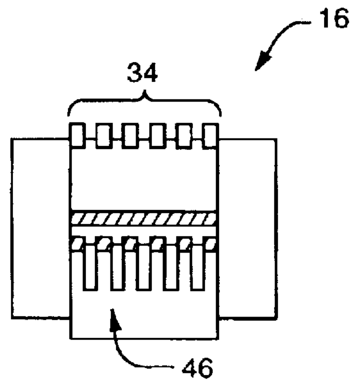
FIG. 3*b* is a front view of the activation cam showing the various circuit alignment systems used.
Figure 3C:
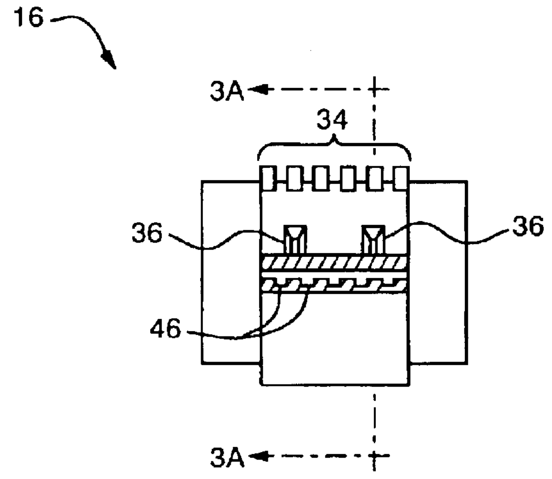
FIG. 3*c* is a back view of an activation cam, where a flexible circuit would exit the cam if the circuit were to pass through the cam.
Figure 3D:
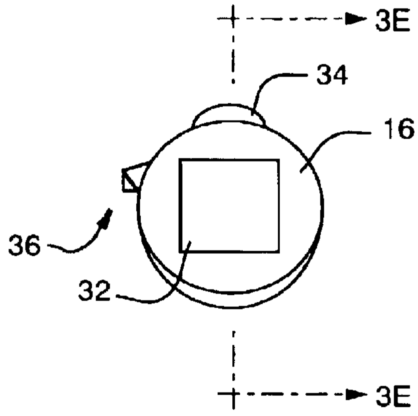
FIG. 3*d* is an end view of an activation cam.

In one embodiment of the invention, to form the electrical connection, conductive circuit 20 is inserted into connector 10 and roughly aligned by circuit alignment window 30 in base 18. Circuit 20 then passes into cam 16 via circuit receptacle slot or notch 38 as shown in FIGS. 1*a* and 3*d*. In this particular illustration, notch 38 extends through cam 16. However, notch 38 need only be able to capture and hold circuit 20 inside cam 16. Thus, depending on the application, it is not necessary that a slot extend all the way through cam 16. There may be simply a slot or notch formed partially through cam 16, into which circuit 20 is inserted, wherein circuit 20 is not able to pass completely through cam 16 but rather is retained in the notch or slot. Circuit 20 is fed into cam 16. Cam 16 is then rotated, which wraps circuit 20 around cam 16 and forces spring contact 14 to contact exposed conductors of circuit 20, or if using a contact 14 with tapered insulation plane 22, to pierce the dielectric 20*a* of circuit 20 and skive off both the dielectric and adhesive 20*a* of circuit 20 sufficient to expose the conductor, for example copper, contained therein. The force exerted by contact 14 is strong enough to peel off the top layer of dielectric and adhesive 20*a*, but does not pierce the conductor. It merely shaves the surface of the conductor. Because of the oval or raised shape of cam 16, contact 14 and circuit 20 are compressed into a gas tight connection. The insertion of circuit 20 into cam 16, the wrapping action of cam 16 on circuit 20 and the peeling of the dielectric 20*a* and adhesive of circuit 20 by spring contact 14 is shown in FIGS. 3*a* and 4. As noted contact 14 may or may not have the tapered, piercing insulation plane 22. An instance where insulation plane 22 would not be used would be if the connection to be made were a gold/gold connection. In such a connection one would not want to pierce and possibly damage the soft gold, and would use a blunt ended low pressure, or zero-insertion force contact. In this type of application the flexible circuit's insulating overlay must be removed from the circuit before it is inserted into the connector.

In addition, base 18 aids in providing structural support, component orientation, and initial alignment of circuit 20. Base 18 orients all components, cam 16 and cover 12 into their proper location, and easily snaps to cover 12, requiring no tools or special skills. As shown in FIG. 1*a*, base 18 also includes a cam orientation indicator or on-off lock 28 that locks cam 16 open (rotatable) or closed (non-rotatable) as required. As discussed above, circuit alignment window 30 of base 18, shown in FIG. 1*b*, provides initial alignment of circuit 20 to circuit receptacle notch 38 of cam 16. Base 18 is relatively easy to manufacture in quantity and its exterior configuration can be easily modified to mate with other commercially available connectors, or designed to interlock with other connectors 10 of the invention to form a modular connector block (not shown). Thus connector blocks having two or more rows of external pins are possible.

In addition connector 10 may have other features which enhance alignment and connection. Alignment ribs 34 disposed on cam 16 aid in aligning the free floating cam 16 to spring contact 14, and also function to straighten, separate and align individual contact pins of contact 14 in the event they may have become bent or out of alignment or proper spacing. The space between alignment ribs 34 precisely matches the thickness of the contact(s) 14 thus removing any alignment tolerance and making fine line attachment possible. Molded-in, tapered registration or alignment pins or posts 36 on cam 16 work in combination with the rotating, locking motion of cam 16 to grab circuit 20, through accurately installed alignment holes 48, shown in FIG. 3*g*, designed to receive the alignment pins 36, and in so doing, accurately align the conductors of circuit 20 to the molded-in deflectable contact 14 as cam 16 is rotated. Alignment holes 48 would need to be created in circuit 20 by a user or manufacturer.

Figure 3E:
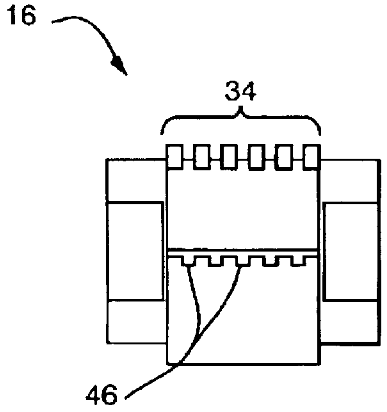
FIG. 3*e* is a sectional view taken along Line "A—A" of FIG. 3*d* without a flexible circuit installed.
Figure 3F:
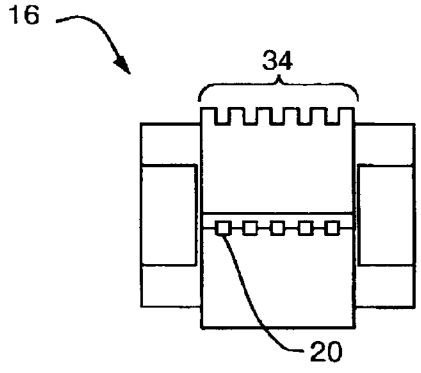
FIG. 3*f* is a sectional view taken along line "A—A" of FIG. 3*d* with a flexible circuit installed.
Figure 3G:
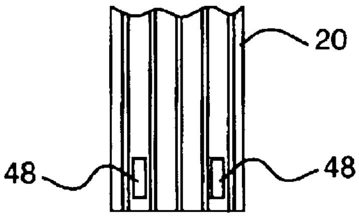
FIG. 3*g* is a top view of a flexible circuit usable with the invention, and having precisely located holes placed through the dielectric separating the individual circuit conductors, to guide the circuit into the connector.

Also included on cam 16 may be conductor alignment grooves, notches or troughs 46 which start approximately 0.050" inside the circuit receptacle notch 38 and taper from the surface to a depth equal to or greater than the laminating trough found between each conductor of a flexible circuit 20. The alignment grooves/notches 46 reach their maximum depth at the point the circuit 20 exits cam 16 in an embodiment in which circuit 20 passes through cam 16. The alignment notches 46 continue around the outer surface of the cam 16 for a distance not greater than ⅛ of the cam's overall circumference. The depth of the alignment notches 46 decreases from the circuit exit point until it blends with the cam's outer surface. The side walls of each alignment notch 46 are angled in such a manner as to center each conductor 20. The alignment notches 46 are built into activation cam 16, as shown in FIGS. 3*b*, 3*c* and 3*e*. The alignment notches 46 are designed to take advantage of the laminating troughs between each conductor of circuit 20. The laminating troughs are created during the laminating process that forms circuit 20 as the dielectric is compressed around each conductor. The troughs in the dielectric of circuit 20 work in conjunction with cam 16's molded-in registration pins 36, and alignment holes 48 of circuit 20, to guide the conductors into proper alignment. The alignment system of the invention is a redundant system to ensure proper alignment of conductors of circuit 20 and contacts 14. In addition to providing an additional alignment feature, alignment notches 46 also prevent circuit discontinuity, damage or disengagement under vibration. Thus, use of activation cam(s) 16 and deflectable contact(s) 14 can accurately align conductors of a fine line (conductors on 0.006 inch pitch centers) flexible circuit to their assigned contacts. Use of cam(s) 16 and its alignment ribs 34, registration pins 36, and alignment grooves/notches 46 significantly reduces the stack up (or compounding) of assembly tolerances.

During connection, as shown in FIG. 4, progressive circuit insertion may be attained by angling the apex of cam 16 in a manner that allows an individual contact of compound dynamic contact 14 to mate with an individual conductor of circuit 20, one contact at a time. This technique significantly reduces circuit insertion force, because one conductor at a time is mated, as opposed to mating 40 or more at a time, even though 40 or more conductors may be mated using connector 10. Additionally, as mentioned above, strain is eliminated on the individual contacts and conductors by wrapping circuit 20 around cam 16 during the connection sequence. Wrapping circuit 20 around cam 16 creates a friction/compression lock on circuit 20 which equalizes stress across the whole circuit 20, thereby protecting circuit 20 from stress and strain within connector 10. Thus, rotating cam 16 structurally supports circuit 20 and forces each contact 14, whether single or compound, to pierce the dielectric of circuit 20 (if applicable and not forming a gold to gold connection) and make contact with each conductor of circuit 20. In addition the shape of cam 16 may be varied to accommodate circuits 20 of various thickness, yet will still fit in a cover 12 and base 18 of one, uniform size. In summary, cam(s) 16 can accurately align itself to a row of deflectable contacts and, once aligned, orient individual conductors of a flexible conductive circuit to mate with their assigned contacts. Rotating the cam(s) forces the flexible circuit to engage the deflectable contact(s) and complete the electrical inter-connection.

Most conductive circuits 20 are formed with a bottom or base layer of dielectric with adhesive to attach the dielectric to the conductor, the conductor, and then a top layer of adhesive and a top layer of dielectric. A great deal of force is not required to be provided by connector 10 and contacts 14 because only one (the top) layer of dielectric is pierced and peeled by the invention.

To activate and attach the spring contact(s), in one embodiment as described above, a rotating cam 16 may be used, however, in another embodiment, the connector containing the spring contact(s) may be a contact module 100, as shown in FIGS. 5*a*–5*e*, instead of a cam with a cover and base. Contact activation module 100 aligns spring contact 102 with a circuit 104 using built-in contact deflection activation ridge 106 (similar in function to alignment ribs 34 on cam 16), a circuit alignment notch 108, and tapered alignment pins 110 to properly align circuit 104. A spring contact 102 is shown with a tapered insulation plane 102*a*. Spring contact 102 is deflected as circuit 104 passes over activation ridge 106, and then pierces and peels back the top layer of dielectric 104*a* and adhesive of circuit 104, as circuit 104 passes through contact module 100.

Contact(s) 102, as with contact 14, may be a single or compound spring contact with a tapered insulation plane 102*a*. Contact(s) 14 and 102 are the elements that actually form the connection—whether by piercing and peeling back the flexible circuit's dielectric or simply making contact with the conductors of the flexible circuit. Contact(s) 102 may also have at least one optional force concentrator 112 that interacts with deflection ridge 106 to ensure good contact between contact(s) 102 and the conductors of circuit 104.

Contact module 100 is comprised in part of a contact support portion 114 which houses contact(s) 102, optional for fine alignment of circuit 104, tapered alignment pins 110, at least one module alignment slot 124, and at least one locking hole 122. There is also a contact activation portion 116 which comprises registration pins 118, which roughly align circuit 104, activation deflection ridge 106, at least one circuit alignment notch 108, and flexible locking arms 120. Arms 120 snap into the at least one latching hole 122 in contact support portion 114 to secure contact support portion 114 and contact activation portion 116 together to form contact module 100.

The assembly sequence for contact module 100 is as follows. Flexible circuit 104 is roughly aligned to registration pins 118 of activation portion 116 and aligned in circuit alignment notch(es) 108. Activation portion 116 is then aligned and inserted into contact support portion 114 using alignment module slot(s) 124. Tapered registration pins 110 of support portion 114 further align circuit 104 as activation portion 116 is inserted into support portion 114. The insertion of activation portion 116 forces, in this particular example, the insulation plane 102*a* of contact(s) 102 to pierce the dielectric of circuit 104 and peel off the dielectric 104*a*, thereby exposing the conductor. Contact(s) 102 is then forced into compression as deflection ridge 106 aligns to force concentrators 112 which forces contact(s) 102 to compress against the exposed conductors of circuit 104, creating a gas-tight, surface finish to surface finish connection. Activation portion 116 and contact support portion 114 are secured together using arms 120 of activation module 116 and latching holes 122 of support portion 114.

In all embodiments, strain is reduced because the force required in the present invention is required only to pierce one layer of the dielectric and peel it back, not to pierce the conductor itself, nor peel off all of the dielectric.

The multi-task connection function performed in essentially one fluid step has many technical (as discussed above) and cost advantages. Conventional 'high density' (contacts on pitch centers less than 0.040 inches) connectors require the removal of the covering dielectric and a soldering or welding operation to attach the connector contacts to the circuit's conductor(s). The attachment process becomes more difficult as the circuit's density (number of conductors per circuit) increases. Typical problems increasing the cost of high density connector attachment include; solder bridging, contact misregistration (alignment), conductor delamination and cold solder joints. The invention eliminates all of the previously mentioned problems by, in one process, piercing through the dielectric of the flexible circuit and making a surface finish to surface finish or metal to metal, gas tight connection using the tapered insulation plane and optional force concentrators of the contact(s) 14 or 102. However, the same spring connection mechanism may be used with a blunt ended contact 14 or 102, to form delicate, for example gold to gold, connections.

The invention coordinates the alignment of a high density, fine line, flexible circuit to a mating compound dynamic contact. Thus the connector provides an essentially fluid process for terminating a conductive circuit, and can terminate up to 80 lines per inch. The process is essentially a two step process, when using an embodiment with a cam. First, free floating activation cam 16 is precisely located to spring contact(s) 14 in the housing comprising cover 12 and base 18, using tapered alignment ribs 34 on cam 16. Next, tapered registration pins 36 of cam 16 work in combination with tapered conductor alignment notches 46 built into cam 16 and with the rotation of cam 16 to grab circuit 20 and accurately align the conductors of circuit 20 to the spring contact 14 of cover 12. Tapered alignment notches 46 of cam 16 also lock circuit 20 in place to provide stability to circuit 20 and the connection being made.

In the alternative, the connection sequence for the embodiment using an contact module with activation and support portions was discussed above, and it can be seen that, with either embodiment, the compliant, flexible, deflectable spring contact(s) compensate for variations in the thickness of the flexible circuit and provide a predictable and reliable contact force. The simple, mechanical components of the invention insure long term reliability. Each spring contact may be positioned to penetrate more than one insulating layer, in order to electronically mate with a flexible circuit having two or more conductive layers. When using a cam, the apex of the cam, and the alignment ribs, may be angled in a manner that allows a single contact of the spring contact to mate with a single circuit conductor of the flexible circuit, one connection at a time. This one by one connection significantly reduces contact insertion force required. Similarly the deflection ridge of the activation portion of the contact module may be angled to provide one by one connection.

The contact(s) and cam(s) may be individually sized to accommodate specific electrical needs, and the connector may be formed to accommodate more than one spring contact and more than one cam. The connector housing the spring contact(s) may be made connectable to form blocks of connectors, depending on the desired task or application. Such possible applications include; the use of a PTH (plated through hole) flexible circuit to change signal direction within the connector or build in test points, active and passive components may be attached to the circuit, or the flexible circuit may be built with an integral network of fuses designed to protect the modules it joins.

In all embodiments, the invention provides a housing for optional tapered or blunt spring contacts, and deflects the spring contact(s), if tapered, to activate its stored energy to pierce and peel back the dielectric of a flexible circuit to make and maintain a reliable electrical interconnection between the spring contact and the conductors of the flexible circuit. The invention provides one fluid process with no scraping or other preparation of the flexible circuit required before introduction of the flexible circuit to the spring contact(s).

The foregoing provides non-limiting description of the invention, for purposes of illustration, and it is not intended to be exhaustive or to limit the invention to the precise forms disclosed. Many variations and modifications of the embodiments described herein will be obvious to one of ordinary skill in the art in light of the above disclosure. The scope of the invention is defined by the appended claims and their equivalents.

What is claimed is:

1. A method of connecting at least one electrical contact to at least one conductive circuit comprising the steps of:

inserting at least one conductive circuit into a circuit alignment window in an electrical connector having a plurality of tapered registration pins, tapered alignment ribs and conductor alignment grooves built into at least one activation cam housed rotatably between a cover and a base;

using said tapered registration pins, and said conductor alignment grooves to align said at least one conductive circuit within a circuit receptacle slot in said at least one activation cam;

rotating said at least one activation cam using an activation tool inserted into a cam activation socket in said at least one activation cam, thereby pulling said at least one conductive circuit into said electrical connector wherein it is wrapped around said at least one activation cam and brought into contact with at least one deflectable contact having a tapered, pointed contact tip forming an insulation;

using said plurality of tapered alignment ribs to align said at least one activation cam with said at least one deflectable contact;

using a tapered insulation plane of each said deflectable contact to pierce and peel back a dielectric insulation of said at least one conductive circuit to expose conductors of at least one conductive circuit; and thereby creating a surface finish to surface finish, gas-tight, partially sealed electrical connection, in said electrical connector between said tapered insulation plane of said at least one deflectable contact and said conductors of at least one conductive circuit.

2. The method of claim 1 wherein said partial seal is made permanent by heating said at least one deflectable contact to a temperature that causes said dielectric insulation to flow and thereby seal the interface between said at least one deflectable contact and said conductors of said at least one conductive circuit.

3. The method according to claim 1 comprising forming an apex of said at least one activation cam at an angle such that a tip of said tapered insulation plane of said at least one deflectable contact pierces and peels back said dielectric insulation of said at least one conductive circuit in a manner to expose, and mate individually with, one by one, the conductors comprising said at least one conductive circuit, thus allowing a single deflectable contact to mate with an individual conductor of said at least one conductive circuit.

4. The method according to claim 1 comprising using the wrapping action of said at least one activation cam to secure said at least one conductive circuit within said electrical connector to support said at least one conductive circuit and eliminate strain on said conductors of said at least one conductive circuit, when in contact with said tip of said tapered insulation plane of said at least one dielectric contact.

5. The electrical connector according to claim 1 wherein said means for attaching an activation portion and a contact support portion together comprises at least one module latching hole formed in said contact support portion, into which snap flexible arms formed on said activation portion.

6. A method of connecting at least one deflectable electrical contact to at least one conductive circuit, comprising the steps of:

inserting at least one conductive circuit into an alignment window in a contact support portion comprising said at least one alignment window, a plurality of registration pin receiving holes, and at least one deflectable contact wherein said deflectable contact comprises a tapered insulation plane;

attaching an activation portion comprising a plurality of registration pins and a deflection ridge;

using the activation portion to align said conductive circuit in said connector;

engaging said activation portion and said support portion together; and deflecting at least one contact by passing said at least one circuit over said deflection ridge such that a tapered insulation plane on said at least one deflectable contact pierces and peels off a top layer of dielectric and adhesive from said at least one conductive circuit, thereby exposing individual conductors of said at least one conductive circuit, to connect to said at least one deflectable contact with a conductive portion of said at least one conductive circuit to form a gas-tight, electrical connection.

7. A method of connecting at least one electrical deflectable contact to at least one conductive circuit comprising the steps of:

aligning the conductive circuit with the deflectable contact;

activating the deflectable contact to engage conductors of the conductive circuit, to form a reliable electrical connection between individual conductors of the conductive circuit and individual contacts of the deflectable contact;

piercing and peeling an upper layer of dielectric insulation and adhesive of the conductive circuit with the deflectable contact, where the deflectable contact is tapered to a pointed insulation plane thereby scraping off a thin layer of conductive material from the conductive circuit; and interfacing a conductive portion of the deflectable contact to form a gas tight partial seal with the now exposed conductors of the conductive circuit.

* * * * *